(12) United States Patent
Steiner et al.

(10) Patent No.: US 9,973,169 B2
(45) Date of Patent: May 15, 2018

(54) SURFACE ACOUSTIC WAVE FILTER WITH A CAP LAYER FOR IMPROVED RELIABILITY

(71) Applicant: RF Micro Devices, Inc., Greensboro, NC (US)

(72) Inventors: Kurt G. Steiner, Orlando, FL (US); Curtiss Hella, Apopka, FL (US); Benjamin P. Abbott, Longwood, FL (US); Daniel Chesire, Winter Garden, FL (US); Chad Thompson, Apopka, FL (US); Alan S. Chen, Windermere, FL (US)

(73) Assignee: Qorvo US, Inc., Greensboro, NC (US)

( * ) Notice: Subject to any disclaimer, the term of this patent is extended or adjusted under 35 U.S.C. 154(b) by 116 days.

(21) Appl. No.: 14/954,224

(22) Filed: Nov. 30, 2015

(65) Prior Publication Data
US 2017/0099042 A1 Apr. 6, 2017

Related U.S. Application Data

(60) Provisional application No. 62/235,861, filed on Oct. 1, 2015.

(51) Int. Cl.
*H03H 9/64* (2006.01)
*H03H 3/10* (2006.01)
(Continued)

(52) U.S. Cl.
CPC ............ *H03H 9/6489* (2013.01); *H03H 3/10* (2013.01); *H03H 9/02622* (2013.01);
(Continued)

(58) Field of Classification Search
CPC .. H03H 3/04; H03H 3/08; H03H 3/10; H03H 9/02559; H03H 9/02614; H03H 9/02622;
(Continued)

(56) References Cited

U.S. PATENT DOCUMENTS

| 5,777,422 A * | 7/1998 | Kitabayashi | ....... H03H 9/02582 |
| | | | 310/313 A |
| 6,909,341 B2 * | 6/2005 | Takayama | ................ H03H 3/08 |
| | | | 29/25.35 |

(Continued)

FOREIGN PATENT DOCUMENTS

| JP | 09-275323 A | * 10/1997 |
| JP | 2001-044787 A | * 2/2001 |

(Continued)

OTHER PUBLICATIONS

English language machine translation of JP 2005-260296 A, published Sep. 22, 2005, 11 pages.*

(Continued)

*Primary Examiner* — Barbara Summons
(74) *Attorney, Agent, or Firm* — Withrow & Terranova, P.L.L.C.

(57) ABSTRACT

Embodiments of a Surface Acoustic Wave (SAW) device, or filter, and methods of fabrication thereof are disclosed. In some embodiments, the SAW filter comprises a piezoelectric substrate and an Interdigitated Transducer (IDT) on a surface of the piezoelectric substrate. The IDT includes multiple fingers, each comprising a metal stack. The SAW filter further includes a cap layer on a surface of the IDT opposite the piezoelectric substrate and on areas of the surface of the piezoelectric substrate exposed by the IDT. The cap layer has a thickness in a range of and including 10 to 500 Angstroms and a high electrical resistivity (and thus a low electrical conductivity). For instance, in some embodiments, the electrical resistivity of the cap layer is greater than 10 kilo-ohm meters (KΩ·m). The SAW filter further includes an oxide overcoat layer on a surface of the cap layer opposite the IDT and the piezoelectric substrate.

18 Claims, 8 Drawing Sheets

(51) Int. Cl.
  *H03H 9/145* (2006.01)
  *H03H 9/02* (2006.01)
  H03H 3/04 (2006.01)
  H03H 9/13 (2006.01)

(52) U.S. Cl.
  CPC .... *H03H 9/02834* (2013.01); *H03H 9/02921* (2013.01); *H03H 9/02929* (2013.01); *H03H 9/02937* (2013.01); *H03H 9/14541* (2013.01); H03H 3/04 (2013.01); H03H 9/131 (2013.01)

(58) Field of Classification Search
  CPC ........... H03H 9/02834; H03H 9/02921; H03H 9/02929; H03H 9/02937; H03H 9/145; H03H 9/14538; H03H 9/14541; H03H 9/25; H03H 9/64; H03H 9/6489; H03H 9/131
  USPC ................................ 333/193–195; 310/313 B
  See application file for complete search history.

(56) References Cited

U.S. PATENT DOCUMENTS

| | | | | |
|---|---|---|---|---|
| 7,459,991 B2* | 12/2008 | Ruile | ................. | H03H 9/02834 310/313 A |
| 8,720,022 B2* | 5/2014 | Matsuda | ................. | H03H 3/10 29/25.35 |
| 9,331,667 B2* | 5/2016 | Steiner | ............... | H03H 9/02834 |
| 2003/0122453 A1* | 7/2003 | Yamada | ............. | H03H 9/02984 310/363 |
| 2004/0070313 A1* | 4/2004 | Furukawa | .......... | H03H 9/02661 310/313 R |
| 2006/0131991 A1* | 6/2006 | Kawakami | ......... | H03H 9/02984 310/311 |
| 2007/0182279 A1* | 8/2007 | Kawano | ................ | G06F 3/0433 310/313 R |
| 2009/0116340 A1* | 5/2009 | Tanaka | ................. | H03H 9/0038 367/137 |
| 2014/0232239 A1* | 8/2014 | Iwasaki | .............. | H03H 9/02984 310/313 C |
| 2016/0190423 A1* | 6/2016 | Tsubokawa | .............. | H03H 3/08 310/313 B |

FOREIGN PATENT DOCUMENTS

JP   2005-260296 A  *  9/2005
JP   2007-028235 A  *  2/2007

OTHER PUBLICATIONS

English language machine translation of JP 2007-028235 A, published Feb. 1, 2007, 5 pages.*

Englsih language machine translation of JP 09-275323 A, published Oct. 21, 1997, 5 pages.*

* cited by examiner

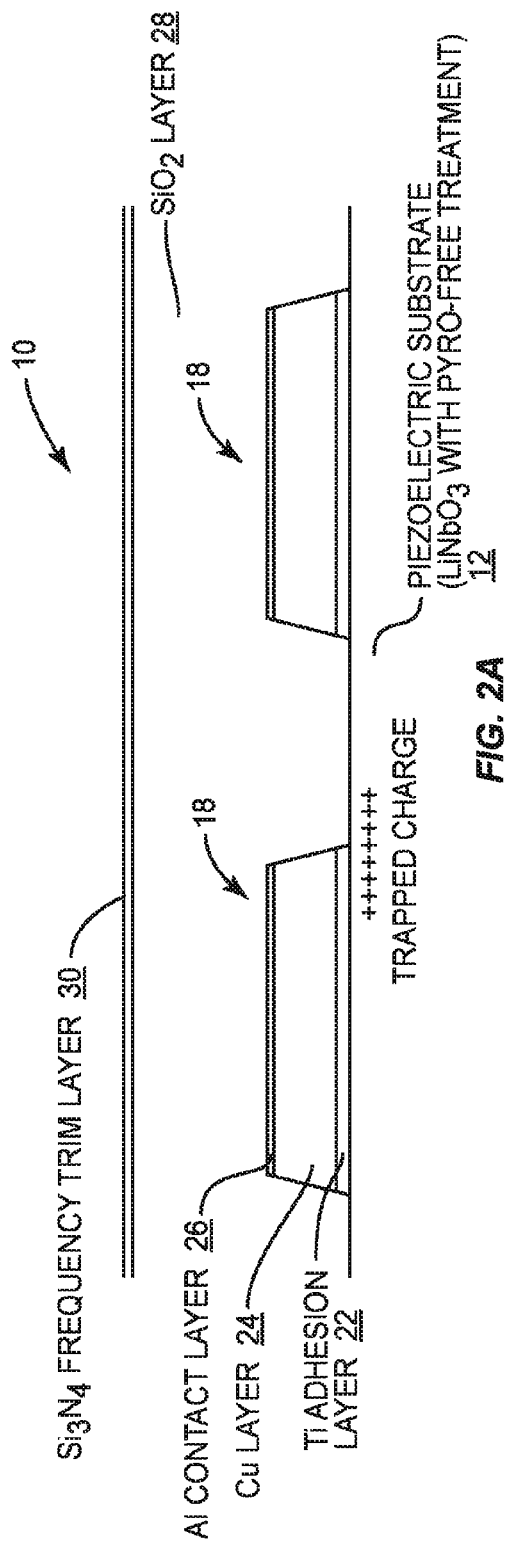
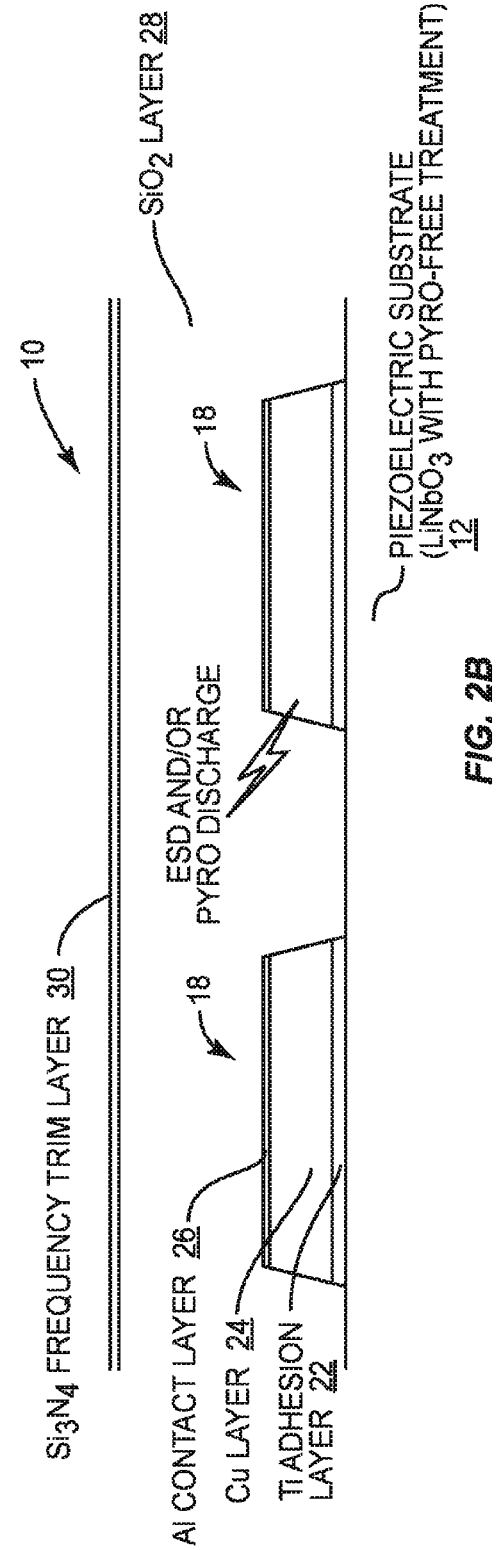
FIG. 2A
FIG. 2B

SURFACE ACOUSTIC WAVE FILTER WITH A CAP LAYER FOR IMPROVED RELIABILITY

RELATED APPLICATIONS

This application claims the benefit of provisional patent application Ser. No. 62/235,861, filed Oct. 1, 2015, the disclosure of which is hereby incorporated herein by reference in its entirety.

FIELD OF THE DISCLOSURE

The present disclosure relates to Surface Acoustic Wave (SAW) filters.

BACKGROUND

Surface Acoustic Wave (SAW) filters are used in many applications such as Radio Frequency (RF) filters. For example, SAW filters are commonly used in Second Generation (2G) and Third Generation (3G) wireless receiver front ends, duplexers, and receive filters. The widespread use of SAW filters is due to, at least in part, that fact that SAW filters exhibit low insertion loss with good rejection, can achieve broad bandwidths, and are a small fraction of the size of traditional cavity and ceramic filters. As with any electronic device, the reliability of a SAW filter is an important parameter that can impact the overall reliability of a wireless system. In this regard, there is a need for a highly reliable SAW filter.

SUMMARY

Embodiments of a Surface Acoustic Wave (SAW) device, or filter, and methods of fabrication thereof are disclosed. In some embodiments, the SAW filter comprises a piezoelectric substrate and an Interdigitated Transducer (IDT) on a surface of the piezoelectric substrate. The IDT includes multiple fingers, each comprising a metal stack. The SAW filter further includes a cap layer on a surface of the IDT opposite the piezoelectric substrate and on areas of the surface of the piezoelectric substrate exposed by the IDT. The cap layer has a thickness in a range of and including 10 to 500 Angstroms and high electrical resistivity (and thus low electrical conductivity). For instance, in some embodiments, the electrical resistivity of the cap layer is greater than 10 kilo-ohm meters (KΩ·m), even more preferably greater than 20 KΩ·m. In some embodiments, the electrical resistivity of the cap layer is in the range of and including 20 KΩ·m to 200 KΩ·m. The SAW filter further includes an oxide overcoat layer on a surface of the cap layer opposite the IDT and the piezoelectric substrate. The cap layer improves the reliability of the SAW filter by, e.g., mitigating the pyroelectric effect on the surface of the piezoelectric substrate, providing a barrier to electro-migration, and/or providing a passivation layer to, e.g., mitigate corrosion due to moisture.

In some embodiments, the surface of the piezoelectric substrate is oxygen depleted such that the pyroelectric effect on the surface of the piezoelectric substrate is suppressed, and the cap layer operates to mitigate degradation of the oxygen depleted surface of the piezoelectric substrate due to the oxide overcoat layer.

In some embodiments, the cap layer includes amorphous Silicon (α-Si). In some embodiments, the cap layer includes α-Si on the surface of the IDT opposite the piezoelectric substrate and on areas of the surface of the piezoelectric substrate exposed by the IDT and a silicide on sidewalls of the fingers of the IDT. Further, in some embodiments, the metal stack of the fingers of the IDT includes a Copper (Cu) layer, and the silicide is Copper Silicide ($CuSi_5$).

In other embodiments, the cap layer includes Silicon Nitride ($Si_3N_4$) on the surface of the IDT opposite the piezoelectric substrate and on areas of the surface of the piezoelectric substrate exposed by the IDT and a silicide on sidewalls of the fingers of the IDT. In other embodiments, the cap layer includes Silicon Carbide (SiC) on the surface of the IDT opposite the piezoelectric substrate and on areas of the surface of the piezoelectric substrate exposed by the IDT and a silicide on sidewalls of the fingers of the IDT. In other embodiments, the cap layer comprises Aluminum Oxide ($Al_2O_3$).

In some embodiments, the thickness of the cap layer is within a range of and including 50 to 150 Angstroms. In other embodiments, the thickness of the cap layer is within a range of and including 50 to 100 Angstroms.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A through 2D illustrate problems associated with a conventional implementation of a SAW filter that negatively impact the reliability of the SAW filter;

DETAILED DESCRIPTION

Figure 1:
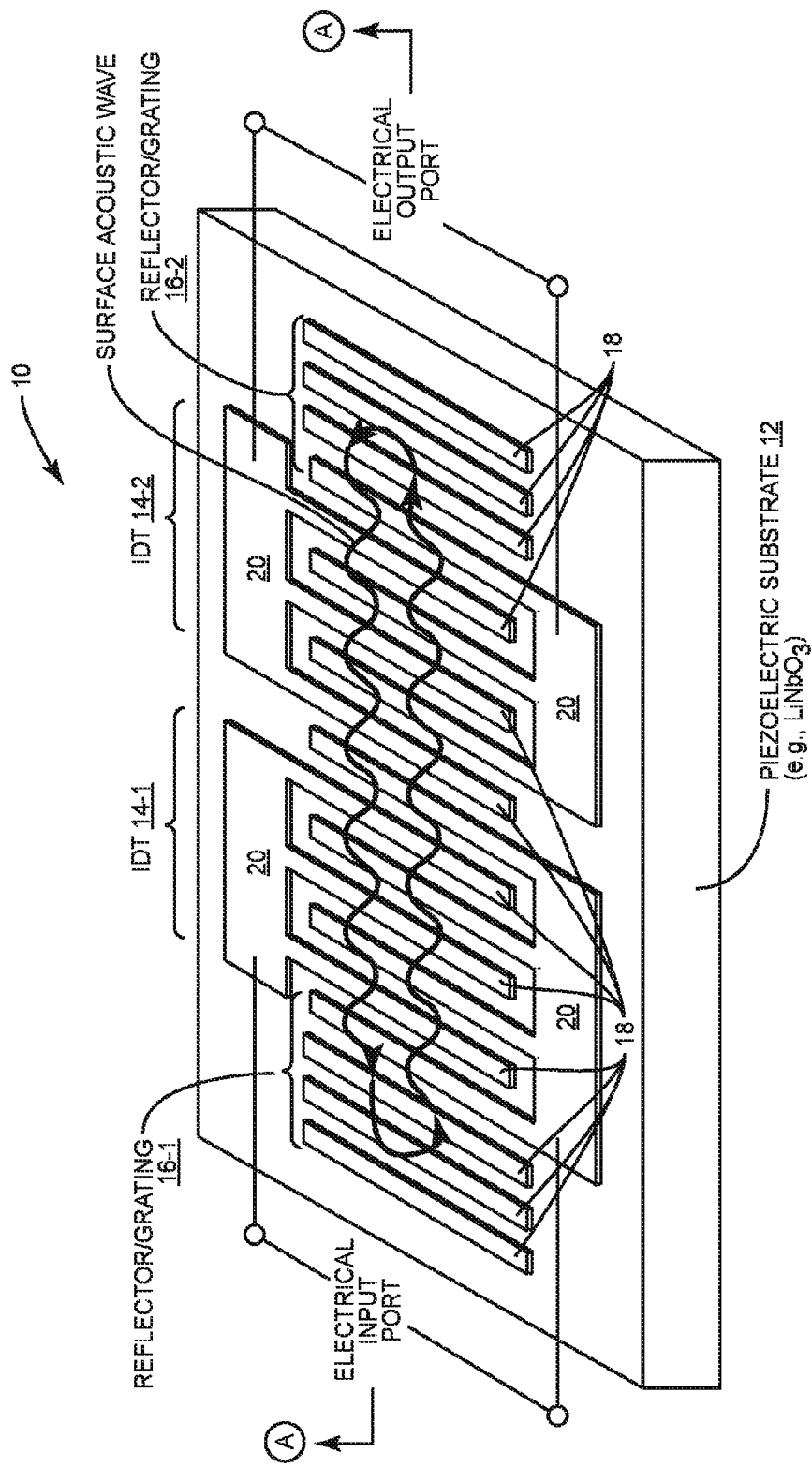
FIG. 1 illustrates one example of a Surface Acoustic Wave (SAW) filter.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

FIG. 1 illustrates one example of a Surface Acoustic Wave (SAW) filter 10. The SAW filter 10 includes a piezoelectric substrate 12, which has a surface on which various types of SAW elements may be formed. The piezoelectric substrate 12 may be any piezoelectric material such as, for example, quartz, Lithium Niobate ($LiNbO_3$), or Lithium Tantalite ($LiTaO_3$). In this example, the SAW filter 10 is implemented according to a Dual-Mode SAW (DMS) architecture, wherein the SAW filter 10 includes two Interdigitated Transducers (IDTs) 14-1 and 14-2 (generally referred to herein collectively as IDTs 14 and individually as IDT 14) positioned between two interdigital reflectors 16-1 and 16-2 (generally referred to herein collectively as reflectors 16 and individually as reflector 16). Both the IDTs 14 and the reflectors 16 include a number of fingers 18 that are connected to opposing bus bars 20. For the IDTs 14, alternating fingers 18 are connected to different bus bars 20, as depicted. Notably, the reflectors 16 and the IDTs 14 generally have a much larger number of fingers 18 than depicted. The number of actual fingers 18 has been significantly reduced in the drawing figures in an effort to more clearly depict the overall concepts employed in available SAW architectures as well as the concepts provided by the present disclosure.

In the embodiment illustrated in FIG. 1, the IDT 14-1 acts as an input of the SAW filter 10. Specifically, the bus bars 20 of the IDT 14-1 correspond to an electrical input port by which an input signal is provided to the SAW filter 10. The other IDT 14-2 acts as an output of the SAW filter 10. Specifically, the bus bars 20 of the IDT 14-2 correspond to an electrical output port by which an output signal is output by the SAW filter 10. The fingers 18 are parallel to one another and aligned within an acoustic cavity, which essentially encompasses the area in which the reflectors 16 and the IDTs 14 reside. In this acoustic cavity, a standing wave or waves (i.e., a SAW(s)) is generated when the IDT 14-1 is excited by an electrical input signal essentially reside within the acoustic cavity. As such, the acoustic wave energy essentially runs perpendicular across the various fingers 18. Notably, the IDTs 14 and the reflectors 16 are oriented in acoustic series, such that the acoustic wave energy moves along the acoustic cavity and perpendicularly across the respective fingers 18 of the IDTs 14 and the reflectors 16.

In operation, an electrical input signal is provided to the IDT 14-1 via the electrical input port of the SAW filter 10. The electrical energy of the electrical input signal is transformed into a SAW(s) via the piezoelectric effect of the piezoelectric substrate 12. The SAW(s) is propagated across the surface of the piezoelectric substrate 12 perpendicular to the fingers 18. At the IDT 14-2, the acoustic energy of the SAW(s) is transformed back into electrical energy, thereby resulting in a (filtered) electrical output signal of the SAW filter 10 at the bus bars 20 of the IDT 14-2, which corresponds to the electrical output port of the SAW filter 10.

Before describing embodiments of the present disclosure that improve the reliability of the SAW filter 10, a discussion of several issues with a conventional implementation of the SAW filter 10 is needed. In this regard, FIGS. 2A through 2D illustrate several issues with a conventional implementation of the SAW filter 10 that result in less than optimal reliability. As illustrated in FIGS. 2A through 2D, the IDTs 14, and in particular the fingers 18 of the IDTs 14, are metal stack structures that include, in this example, a Titanium (Ti) adhesion layer 22 on (e.g., directly on) the surface of the piezoelectric substrate 12, a Copper (Cu) layer 24 on (e.g., directly on) the surface of the Ti adhesion layer 22 opposite the piezoelectric substrate 12, and an Aluminum (Al) contact layer 26 on (e.g., directly on) the Cu layer 24. The piezoelectric substrate 12 in the examples of FIGS. 2A through 2D is $LiNbO_3$.

The piezoelectric substrate 12 has pyroelectric properties. The pyroelectric effect causes the piezoelectric substrate 12 to generate a charge as the temperature of the piezoelectric substrate 12 changes. In some implementations, the piezoelectric substrate 12 is pyro-suppressed by oxygen depletion of the surface of the piezoelectric substrate 12. Using $LiNbO_3$ as an example, the $LiNbO_3$ molecule consists of one Lithium atom, one Niobium atom, and three Oxygen atoms. Oxygen depleted $LiNbO_3$ has vacancies in place of some of the Oxygen atoms. As illustrated, the SAW filter 10 includes a Silicon Dioxide ($SiO_2$) overcoat layer 28 that provides temperature compensation. The $SiO_2$ overcoat layer 28 is provided on (e.g., directly on) the surface of the SAW filter 10 over the IDTs 14 and the reflectors 16. Lastly, the SAW filter 10 includes a Silicon Nitride ($Si_3N_4$) frequency trim layer 30 that tunes the frequency of the SAW filter 10. An unwanted effect of the $SiO_2$ overcoat layer 28 is that it degrades the pyro-suppression of the surface of the piezoelectric substrate 12, thereby allowing charges to generate on the surface of the piezoelectric substrate 12 as temperature changes. This reduces the reliability of the SAW filter 10. In addition, the reliability of the SAW filter 10 is negatively impacted by Cu migration along the depleted interface and corrosion from moisture.

More specifically, as illustrated in FIG. 2A, due to the degraded pyro-suppression of the surface of the piezoelectric substrate 12 resulting from the $SiO_2$ overcoat layer 28, a significant amount of trapped charges form at the surface of the piezoelectric substrate 12 as the temperature of the piezoelectric substrate 12 changes. When the SAW filter 10 is utilized as a transmit filter (e.g., in a duplexer) of a wireless transceiver, the trapped charges in proximity to the fingers 18 of the IDTs 14 result in a non-linear response in the transmit band when power is applied to the wireless transceiver. Resulting intermodulated content may then fall in the receive band, which in turn desensitizes the receiver (i.e., causes a "desense" effect).

As illustrated in FIG. 2B, another issue is that the pyroelectric charging (i.e., the charge that builds up at the surface of the piezoelectric substrate 12 due to the pyroelectric effect) is in proportion to the change in temperature. If the inducted charge is of sufficient size/amount, an Electro-Static Discharge (ESD) event will occur. This ESD will catastrophically damage the SAW filter 10 or break the wafer. One solution to this problem is the use of the pyro-suppressed piezoelectric substrate 12 and tying all electrodes of the SAW filter 10 to ground through large resistors (e.g., >1 kilo-ohms (k$\Omega$)), which take up valuable space and cause attenuation.

Figure 2C:
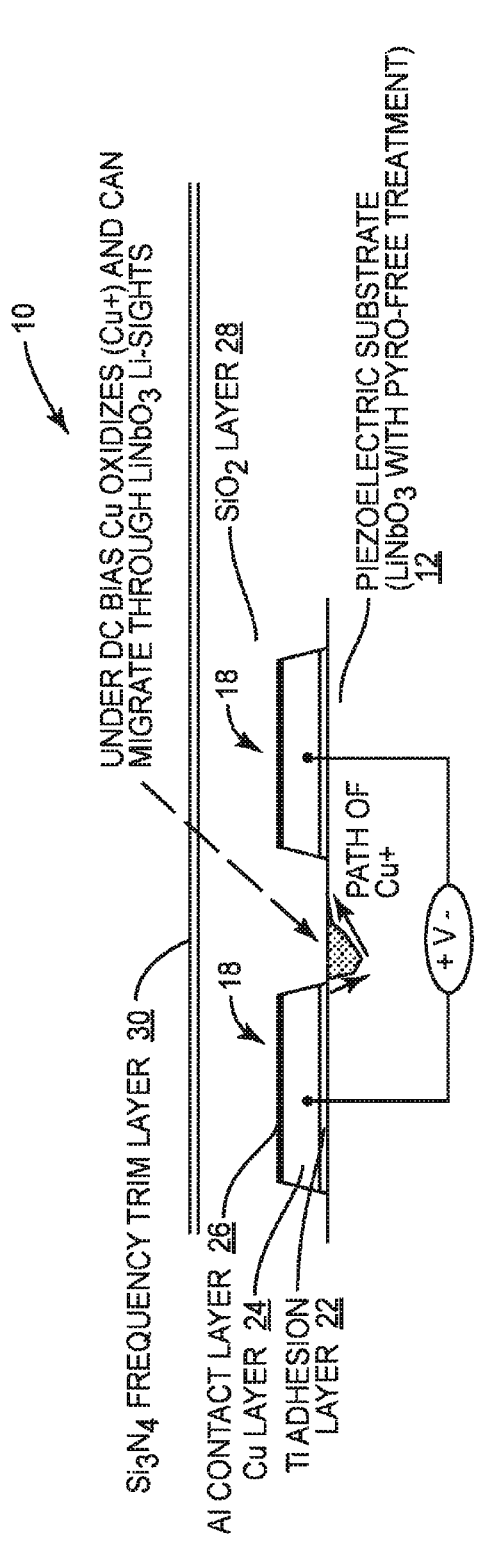

As illustrated in FIG. 2C, another issue is bias driven migration of Cu from the Cu layer 24. In particular, under Direct Current (DC) bias, Cu from the Cu layer 24 can migrate through the depleted $LiNbO_3$. The Cu+ ions are sourced from the fingers 18 having positive potential and migrate toward the fingers 18 having negative potential. One solution to this problem is the use of a blocking capacitor on module (Printed Circuit Board (PCB) or laminate), but this takes up valuable space and adds cost.

Figure 2D:
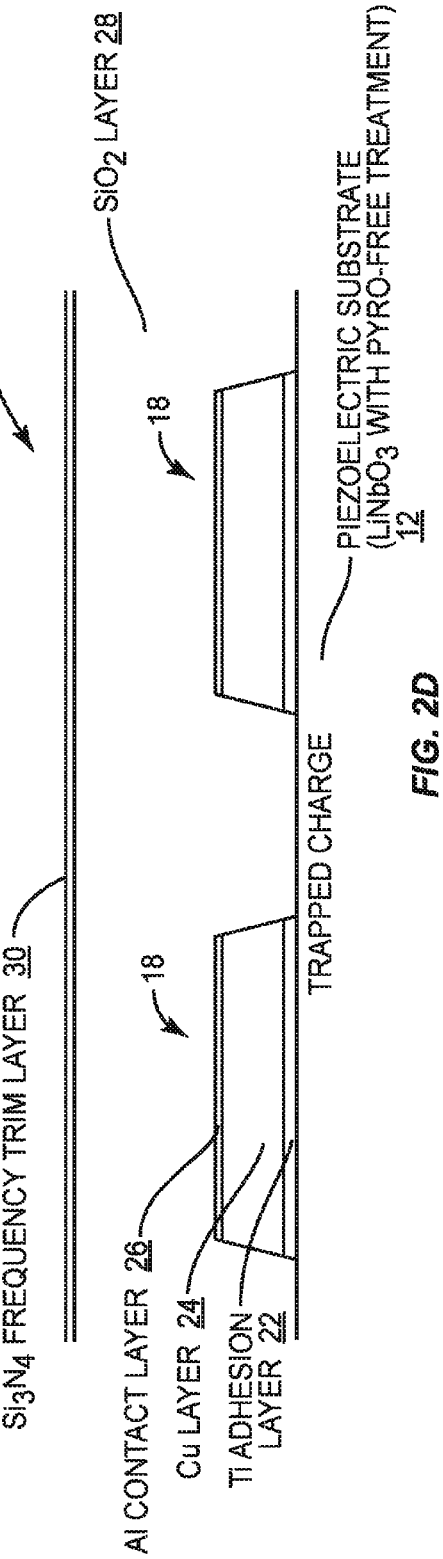

Lastly, as illustrated in FIG. 2D, corrosion due to moisture is also an issue. One solution is to limit the amount of trimming applied to the $Si_3N_4$ frequency trim layer 30 (e.g., ensure that >300 Angstroms of $Si_3N_4$ remains). However, this frequency trim limitation impacts yield.

Figure 3:
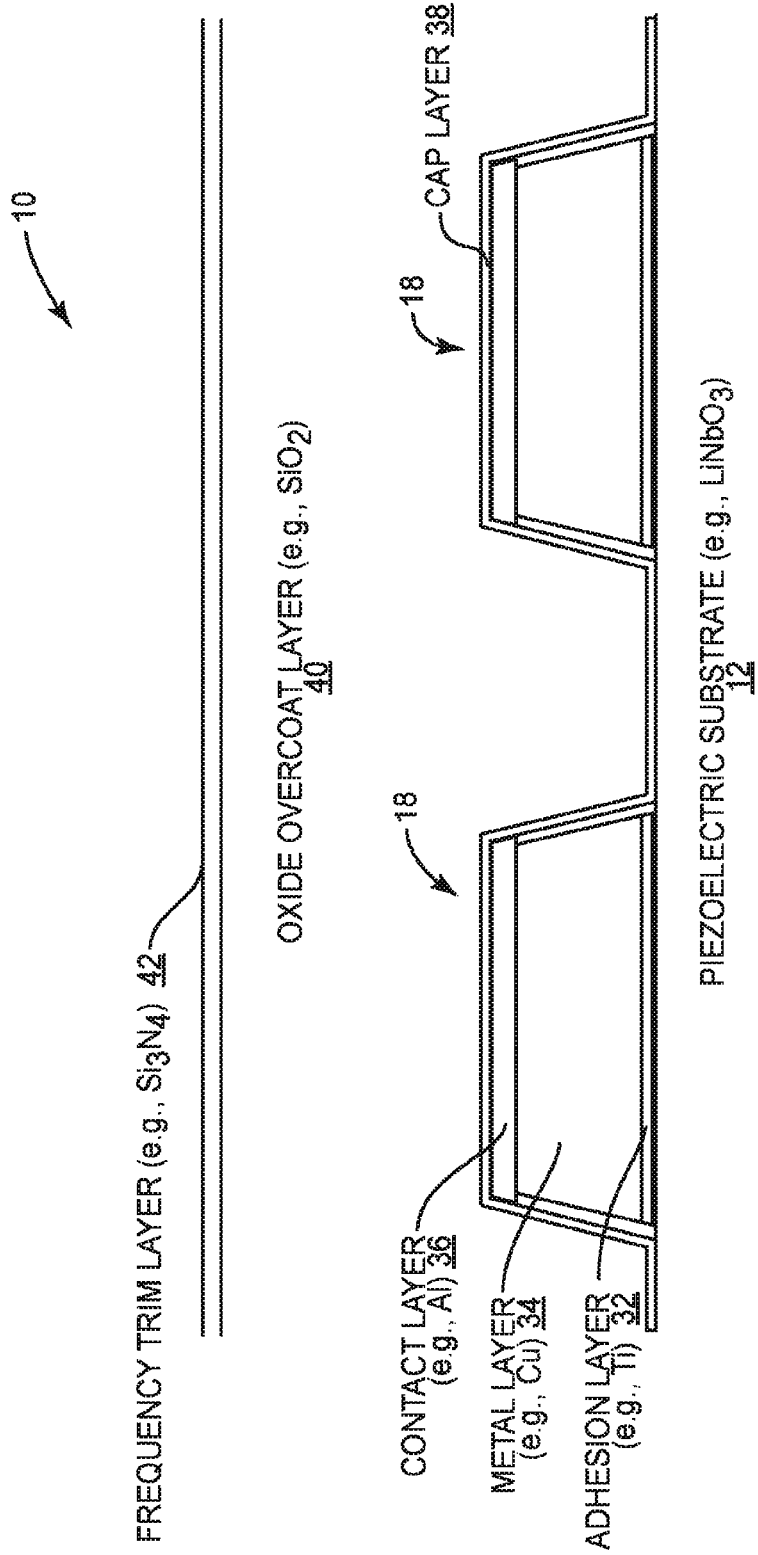
FIG. 3 is a cross-sectional view of two of the Interdigitated Transducer (IDT) fingers of the SAW filter of FIG. 1 according to some embodiments of the present disclosure.

FIG. 3 is a cross-sectional view of two of the fingers 18 of the SAW filter 10 according to some embodiments of the present disclosure. Note that while FIG. 3 only illustrates two of the fingers 18 for clarity and ease of discussion, it should be appreciated that this discussion is applicable to all of the fingers 18, or at least all of the fingers 18 of the IDTs 14 of the SAW filter 10. As illustrated, the fingers 18 have metal stack structures including, in this example, an adhesion layer 32 (e.g., Ti) on (e.g., directly on) the surface of the piezoelectric substrate 12, a metal layer 34 (e.g., Cu, an Aluminum Copper alloy (AlC), Molybdenum (Mo), Nickel (Ni), Chromium (Cr), Platinum (Pt), Silver (Ag), Al, Ti, or any alloy(s) or combination thereof) on (e.g., directly on) the surface of the adhesion layer 32 opposite the piezoelectric substrate 12, and a contact layer 36 (e.g., Al) on (e.g., directly on) the metal layer 34 opposite the adhesion layer 32. Note, however, that the metal stack may vary depending on the particular implementation and may more generally include any number of one or more metal layers.

In addition, the SAW filter 10 includes a cap layer 38 on (e.g., directly on) the surface of the fingers 18 and the exposed areas of the piezoelectric substrate 12 (i.e., those area not covered by the fingers 18 and the bus bars 20). In general, the cap layer 38 is a thin layer having low (non-zero) electrical conductivity. The thickness of the cap layer 38 may, for example, be in the range of and including 10-500 Angstroms, more preferably in the range of and including 50-150 Angstroms, and even more preferably in the range of and including 50-100 Angstroms. The electrical resistivity of the cap layer 38 may be, for example, greater than 10 kilo-ohm meters (K$\Omega$·m), and even more preferably greater than 20 K$\Omega$·m. In some embodiments, the electrical resistivity of the cap layer 38 is in the range of and including 20 K$\Omega$·m to 200 K$\Omega$·m.

In some embodiments, the cap layer 38 consists of a thin layer of low (non-zero) electrical conductivity amorphous Silicon ($\alpha$-Si) on the surface of the IDTs 14 and the exposed areas of the surface of the piezoelectric substrate 12 and a silicide (e.g., Copper Silicide ($CuSi_5$) when the metal layer 34 is Cu) on the sidewalls of the fingers 18. The cap layer 38 of $\alpha$-Si and the silicide addresses the problems described above. In particular, the cap layer 38 of $\alpha$-Si and the silicide on the sidewalls of the fingers 18 enhance pyroelectric suppression at the surface of the piezoelectric substrate 12, effectively resolving the desense issue. Further, the cap layer 38 of $\alpha$-Si and silicide on the sidewalls of the fingers 18 provides an electrical conduction path between the fingers 18, which provides an effective means to dissipate any charge produced by the pyroelectric effect, which addresses, e.g., the ESD problem described above. Further, in embodiments where the silicide on the sidewalls of the fingers 18 is $CuSi_5$, the properties of $CuSi_5$ are intermediate between an ionic compound and an alloy. $CuSi_5$ is insoluble in water and provides a passivation layer and diffusion/electro-migration barrier. Thus, the $CuSi_5$ prevents corrosion due to moisture and operates as a barrier to bias driven migration of Cu+. The thickness of the cap layer 38 of $\alpha$-Si and silicide may, for example, be in the range of and including 10-500 Angstroms, more preferably in the range of and including 50-150 Angstroms, and even more preferably in the range of and including 50-100 Angstroms. For instance, in some embodiments, the electrical resistivity of the cap layer 38 of $\alpha$-Si and silicide is greater than 10 K$\Omega$·m, and even more preferably greater than 20 K$\Omega$·m. In some embodiments, the electrical resistivity of the cap layer 38 is in the range of and including 20 K$\Omega$·m to 200 K$\Omega$·m.

Note, however, that the cap layer 38 is not limited to $\alpha$-Si. Other materials may be used. Some examples of other materials that may be used for the cap layer 38 are $Si_3N_4$, Silicon Carbide (SiC), Aluminum Oxide ($Al_2O_e$), Tantalum Pentoxide ($Ta_2O_5$), Hafnium Oxide ($HfO_2$), Titanium Nitride (TiN), or other metallic oxides or nitrides. Notably, $Si_3N_4$ and SiC will result in a silicide being formed on the sidewalls of the fingers 18, as described above. In some embodiments, the piezoelectric substrate 12 is pyro-suppressed, or pyro-free, by oxygen depletion of the surface of the piezoelectric substrate 12, and the cap layer 38 can be formed of any low conductivity material that prevents degradation of the pyro-suppressed surface of the piezoelectric substrate 12 by an oxide overcoat layer 40. In addition, the material used for the cap layer 38 may be selected such as to provide a barrier to migration of metal ions and/or moisture.

The SAW filter 10 also includes the oxide overcoat layer 40 (e.g., a $SiO_2$ layer) on (e.g., directly on) the surface of the cap layer 38 opposite the fingers 18 and the piezoelectric substrate 12. Lastly, the SAW filter 10 includes a frequency trim layer 42 (e.g., a $Si_3N_4$ layer) on (e.g., directly on) the surface of the oxide overcoat layer 40 opposite the cap layer 38. The thickness of the frequency trim layer 42 is selected to tune the frequency of the SAW filter 10.

Figure 4A:
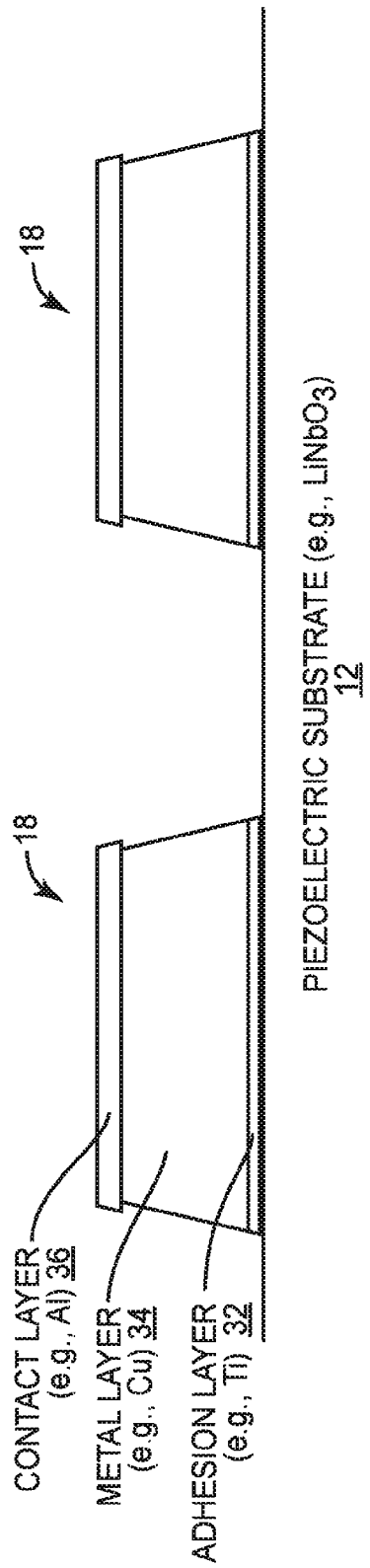
FIGS. 4A through 4D graphically illustrate a process for fabricating the SAW filter of FIGS. 1 and 3 according to some embodiments of the present disclosure.
Figure 4B:
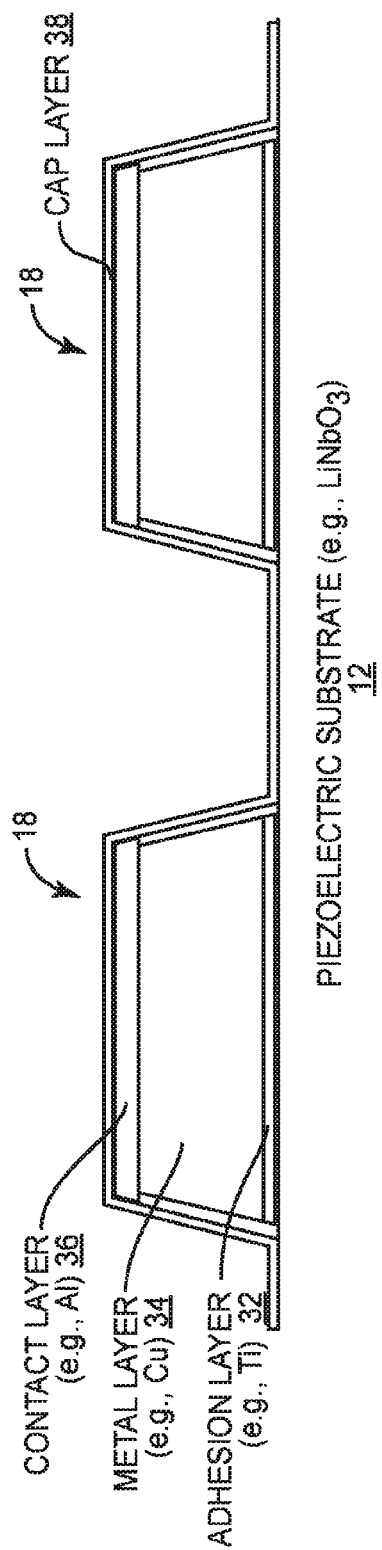
Figure 4C:
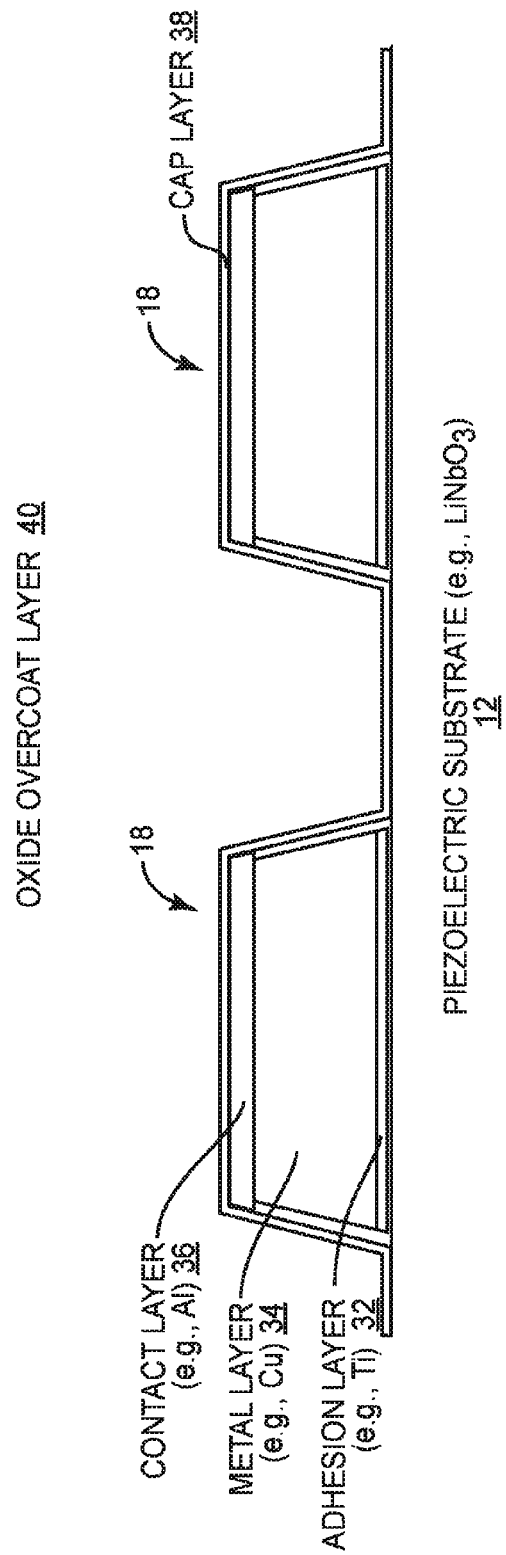
Figure 4D:
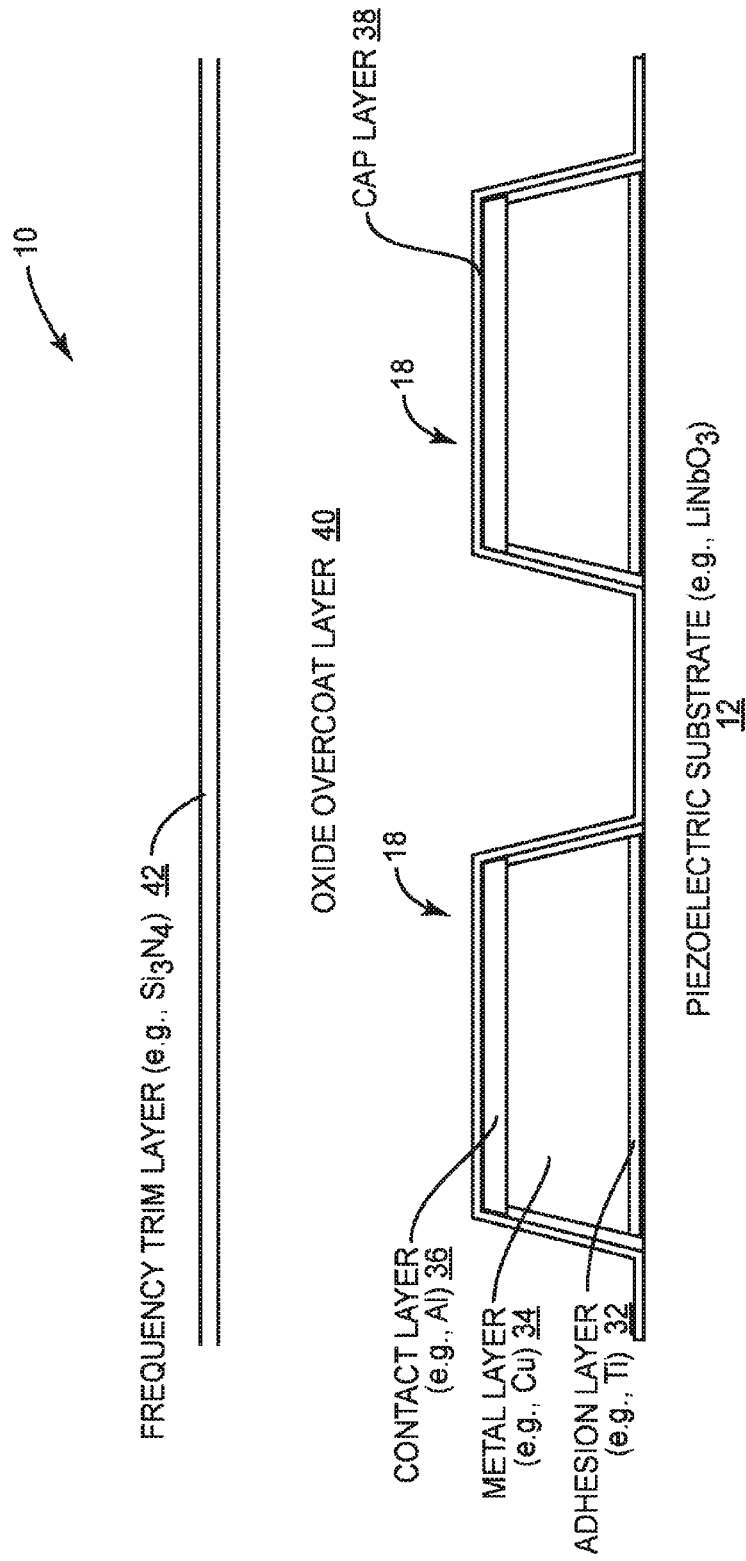

FIGS. 4A through 4D graphically illustrate a process for fabricating the SAW filter 10 according to some embodiments of the present disclosure. As illustrated in FIG. 4A, the fingers 18 (and bus bars 20, not shown) are first provided, or formed, on (e.g., directly on) the surface of the piezoelectric substrate 12. In some embodiments, the process is then completed in a Plasma Enhanced Chemical Vapor Deposition (PECVD) reactor, where, in order to remove oxide (e.g., Cu oxide) that has formed on the sidewalls of the metal layer 34, the oxide is reduced in an Ammonia (NH$_3$) plasma. The growth chamber of the PECVD reactor is then purged (e.g., an Argon (Ar) chamber purge). In this example, the cap layer 38 is formed of α-Si and silicide. As such, next, the cap layer 38 of α-Si is formed by striking a Silane (SiH$_4$) plasma, as illustrated in FIG. 4B. The SiH$_4$ plasma silicides the native metal (e.g., Cu) surface on the sidewalls of the fingers 18 and deposits a thin layer of, in this example, α-Si on the entire surface of the fingers 18 and the exposed surface of the piezoelectric substrate 12. The oxide overcoat layer 40 is then formed on (e.g., directly on) the surface of the cap layer 38 opposite the fingers 18 and the piezoelectric substrate 12, as illustrated in FIG. 4C. Lastly, the frequency trim layer 42 is formed on (e.g., directly on) the surface of the oxide overcoat layer 40 opposite the cap layer 38. Notably, while a PECVD process is described above, other growth techniques may be used. For example, in some embodiments, the cap layer 38, and possibly the oxide overcoat layer 40 and the frequency trim layer 42, are formed via a Physical Vapor Deposition (PVD) process or sputtering.

Those skilled in the art will recognize improvements and modifications to the preferred embodiments of the present disclosure. All such improvements and modifications are considered within the scope of the concepts disclosed herein and the claims that follow.

What is claimed is:

1. A Surface Acoustic Wave (SAW) filter comprising:
    a piezoelectric substrate;
    an Interdigitated Transducer (IDT) on a surface of the piezoelectric substrate, the IDT comprising a plurality of fingers each comprising a metal stack;
    a cap layer on a surface of the IDT opposite the piezoelectric substrate and on areas of the surface of the piezoelectric substrate exposed by the IDT, the cap layer having a thickness in a range of and including 10 to 500 Angstroms, and having an electrical resistivity that is greater than 10 kilo-ohmmeters (KΩ·m); and
    an oxide overcoat layer on a surface of the cap layer opposite the IDT and the piezoelectric substrate;
    wherein the cap layer comprises at least one of the following features: (i) the cap layer comprises amorphous Silicon (α-Si) or on the surface of the IDT opposite the piezoelectric substrate and on the areas of the surface of the piezoelectric substrate exposed by the IDT, or (ii) the cap layer comprises a silicide on sidewalls of the plurality of fingers of the IDT.

2. The SAW filter of claim 1 wherein the surface of the piezoelectric substrate is oxygen depleted such that a pyroelectric effect on the surface of the piezoelectric substrate is suppressed, and the cap layer operates to mitigate degradation of the oxygen depleted surface of the piezoelectric substrate due to the oxide overcoat layer.

3. The SAW filter of claim 2 wherein the cap layer comprises amorphous Silicon (α-Si) on the surface of the IDT opposite the piezoelectric substrate and on the areas of the surface of the piezoelectric substrate exposed by the IDT.

4. The SAW filter of claim 2 wherein the cap layer comprises:
    amorphous Silicon (α-Si) on the surface of the IDT opposite the piezoelectric substrate and on the areas of the surface of the piezoelectric substrate exposed by the IDT; and
    a silicide on sidewalls of the plurality of fingers of the IDT.

5. The SAW filter of claim 4 wherein the metal stack of the plurality of fingers of the IDT comprises a Copper (Cu) layer, and the silicide is Copper Silicide (CuSi$_5$).

6. The SAW filter of claim 2 wherein the cap layer comprises:
    a silicide on sidewalls of the plurality of fingers of the IDT.

7. The SAW filter of claim 2 wherein the cap layer comprises:
    Silicon Carbide (SiC) on the surface of the IDT opposite the piezoelectric substrate and on the areas of the surface of the piezoelectric substrate exposed by the IDT; and
    a silicide on sidewalls of the plurality of fingers of the IDT.

8. The SAW filter of claim 1 wherein the thickness of the cap layer is within a range of and including 50 to 150 Angstroms.

9. The SAW filter of claim 1 wherein the thickness of the cap layer is within a range of and including 50 to 100 Angstroms.

10. A method of fabricating a Surface Acoustic Wave (SAW) filter, comprising:
    forming an Interdigitated Transducer (IDT) on a surface of a piezoelectric substrate, the IDT comprising a plurality of fingers each comprising a metal stack;
    forming a cap layer on a surface of the IDT opposite the piezoelectric substrate and on areas of the surface of the piezoelectric substrate exposed by the IDT, the cap layer having a thickness in a range of and including 10 to 500 Angstroms, and having an electrical resistivity that is greater than 10 kilo-ohmmeters (KΩ·m), wherein forming the cap layer comprises at least one of the following items: (i) forming the cap layer comprises forming a layer of amorphous Silicon (α-Si) or on the surface of the IDT opposite the piezoelectric substrate and on the areas of the surface of the piezoelectric substrate exposed by the IDT, or (ii) forming the cap layer comprises forming a silicide on sidewalls of the plurality of fingers of the IDT; and
    forming an oxide overcoat layer on a surface of the cap layer opposite the IDT and the piezoelectric substrate.

11. The method of claim 10 wherein the surface of the piezoelectric substrate is oxygen depleted such that a pyroelectric effect on the surface of the piezoelectric substrate is suppressed, and forming the cap layer comprises forming the cap layer on the surface of the IDT opposite the piezoelectric substrate and on the areas of the surface of the piezoelectric substrate exposed by the IDT such that the cap layer mitigates degradation of the oxygen depleted surface of the piezoelectric substrate due to the oxide overcoat layer.

12. The method of claim 11 wherein forming the cap layer comprises forming a layer of amorphous Silicon (α-Si) on the surface of the IDT opposite the piezoelectric substrate and on the areas of the surface of the piezoelectric substrate exposed by the IDT.

13. The method of claim 11 wherein forming the cap layer comprises:
    forming a layer of amorphous Silicon (α-Si) on the surface of the IDT opposite the piezoelectric substrate and on the areas of the surface of the piezoelectric substrate exposed by the IDT and a silicide on sidewalls of the plurality of fingers of the IDT.

14. The method of claim 13 wherein forming the IDT is configured such that the metal stack of the plurality of fingers of the IDT comprises a Copper (Cu) layer, further wherein the silicide is Copper Silicide (CuSi$_5$).

15. The method of claim 11 wherein forming the cap layer comprises:
 forming a silicide on sidewalls of the plurality of fingers of the IDT.

16. The method of claim 11 wherein forming the cap layer comprises:
 forming a layer of Silicon Carbide (SiC) on the surface of the IDT opposite the piezoelectric substrate and on the areas of the surface of the piezoelectric substrate exposed by the IDT and a silicide on sidewalls of the plurality of fingers of the IDT.

17. The method of claim 10 wherein the thickness of the cap layer is within a range of and including 50 to 150 Angstroms.

18. The method of claim 10 wherein the thickness of the cap layer is within a range of and including 50 to 100 Angstroms.

\* \* \* \* \*

UNITED STATES PATENT AND TRADEMARK OFFICE
CERTIFICATE OF CORRECTION

PATENT NO. : 9,973,169 B2  
APPLICATION NO. : 14/954224  
DATED : May 15, 2018  
INVENTOR(S) : Kurt G. Steiner et al.

Page 1 of 1

It is certified that error appears in the above-identified patent and that said Letters Patent is hereby corrected as shown below:

In the Claims

In Column 7, Line 40, replace "kilo-ohmmeters" with --kilo-ohm·meters--.

In Column 8, Line 33, replace "kilo-ohmmeters" with --kilo-ohm·meters--.

Signed and Sealed this
Twenty-sixth Day of June, 2018

Andrei Iancu
*Director of the United States Patent and Trademark Office*